United States Patent
Barnfield et al.

(10) Patent No.: US 6,324,680 B1
(45) Date of Patent: Nov. 27, 2001

(54) SYNTHESIS OF ARRAYS AND RECORDS

(75) Inventors: Stephen Barnfield, New York; Reinaldo A. Bergamaschi, Tarrytown; Pradip K. Jha, Wappingers Falls, all of NY (US); Rudra Mukherjee, Santa Clara, CA (US); John D. Weaver, Milbrook, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/385,307

(22) Filed: Aug. 30, 1999

(51) Int. Cl.[7] ............................................. G06F 17/50

(52) U.S. Cl. .................................... 716/18; 703/16

(58) Field of Search ............................ 716/1–21

(56) References Cited

U.S. PATENT DOCUMENTS

| | | | |
|---|---|---|---|
| 5,175,843 | * 12/1992 | Casvant et al. .......................... | 716/6 |
| 5,742,814 | 4/1998 | Balasa et al. ....................... | 707/102 |
| 5,764,951 | * 6/1998 | Ly et al. ................................... | 716/1 |
| 5,801,958 | * 9/1998 | Dangelo et al. ...................... | 716/18 |
| 5,831,864 | * 11/1998 | Raghunathan et al. .................. | 716/2 |

FOREIGN PATENT DOCUMENTS

| | | | |
|---|---|---|---|
| 05-334465-A | * 12/1993 | (JP) ................................ | G06F/15/82 |
| 11-015865 | * 1/1999 | (JP) ................................ | G06F/17/50 |
| 11-096203-A | * 4/1999 | (JP) ................................ | G06F/17/50 |

OTHER PUBLICATIONS

Blumenrohr et al., "On the efficiency of formal synthesis—experimental results", IEEE Transactions on Computer-Aided Design of Integrated Circuits and Systems, Jan. 1999, pp. 25–32.*

Kumar et al., "Low–power binding of function units in high–level synthesis", 42nd Midwest Symposium on Circuits and Systems, vol. 1, Aug. 8, 1999, pp. 214–217.*

Bergamaschi, "Behavioral network graph unifying the domains of high–level and logic synthesis", Proceedings of the 36th Design Automation Conference, Jun. 21, 1999, pp. 213–218.*

Ramachandran et al., "An Algorith for Array Variable Clustering," IEEE 1994, pp. 262–266.

Marwedel et al., "RAM–based architectural synthesis," Logica and Architecture Synthesis, State of the Art and Novel Approaches, Part Eight, Link to Libraries, pp. 234–244. No date.

Lippens et al., "Allocation of Multiport Memories for Hierarchical Data Streams," IEEE 1993, pp. 728–735.

Séméria et al., "SpC: Synthesis of Pointers in C Application of Pointer Analysis to the Behavioral Synthesis from C," IEEE/ACM Digest of Technical Papers, 1998, pp. 340–346, Nov. 12, 1998.

* cited by examiner

Primary Examiner—Matthew Smith
Assistant Examiner—Phallaka Kik
(74) Attorney, Agent, or Firm—F. Chau & Associates, LLP (57) ABSTRACT

A method for synthesizing aggregate data types, in accordance with the present invention, includes representing aggregate data types in a control data flow graph, by representing aggregate objects as operand nodes, and operations on the aggregate objects as operation nodes. One-dimensional bit vectors are formed for the operand nodes, by recursively traversing through fields of the aggregate data type associated with the aggregate objects. Read and write operation nodes are formed in the control data flow graph for representing language constructs for accessing the aggregate objects. The control data flow graph is mapped onto hardware.

21 Claims, 5 Drawing Sheets

```
Type SIMPLE_REC is record                    -- 8 bits
     G1: bit_vector(0 to 2);                 -- 3 bits
     G2: bit_vector(4 downto 0);             -- 5 bits
end record;

Type SIMPLE_ARR is array(0 to 5) Of SIMPLE_REC; -- 48 bits
Type REC_ARR is record                       -- 80 bits
     F1: integer;                            -- 32 bits
     F2: SIMPLE_ARR;                         -- 48 bits
end record;

Signal S, V : REC_ARR;                       -- 80 bits
Signal i, j : integer range 0 to 5;
Signal k, l : integer range 0 to 2;
Signal m, n : integer range 0 to 4;
Signal bita, bitb : bit;
Signal bva, bvb : bit_vector(0 to 2);
Signal inta, intb : integer;
Process
Begin
   Wait until not clock stable and clock= '1';
   V    <= S;                                -- op1: V(0..79) <= S(0..79)
   inta <= S.F1;                             -- op2: inta <= S(0..31)
   bva  <= S.F2(1).G1;                       -- op3: bva <= S(40..42)
   bita <= S.F2(5).G2(1);                    -- op4: bita <= S(78)
   S.F2(i).G2(m) <= bitb;                    -- op5
   bita <= S.F2(j).G1(k);                    -- op6
end process;
```

SYNTHESIS OF ARRAYS AND RECORDS

BACKGROUND OF THE INVENTION

1. Field of the Invention

The present invention relates to high level, register transfer and logic synthesis for circuitry, and more particularly to a method for synthesizing aggregate data types, such as arrays and records, in a general manner.

2. Description of the Related Art

Aggregate data types, such as arrays and records, are often used in describing circuit designs at higher-levels of abstraction. These complex data types are useful for grouping related data into a single object, which makes the description more readable and concise.

From a design style point of view, the use of aggregate data types makes a design description more maintainable. For example, if records are used as ports in a design, it is very easy to add new inputs and outputs by simply adding fields to the existing records, without having to change the other parts of the design which instantiate the changed design component. This effectively helps maintain a fixed I/O definition for all components in the design.

Another reason for the frequent usage of arrays and records originates from their frequent usage in software languages. Many methodologies today, for example, incorporate the use of the C programming language for algorithmic development. This 'C' description is then translated to a hardware description language (HDL) (e.g., VHDL (very high speed integration circuit HDL) or Verilog) for synthesis. Synthesis includes realizing a physical layout based on the programming language algorithm and data structure. The arrays and records used in the 'C' description can be mapped directly to arrays and records in the HDL. Thus, it is important to be able to synthesize these data types efficiently.

One problem in synthesizing arrays and records lies in being able to implement in hardware the different ways in which these arrays and records may be read from or written to. For example, an array object may be assigned as a whole to another array object or accessed with an index (an indexed operation) or with a range of indexes (a slice operation). Similarly, records may be accessed as a whole, or via separate fields. From a synthesis point of view, an indexed operation on a 1-dimensional array requires an address decoder. Multi-dimensional arrays will require multiple levels of address decoding. The address decoding logic can get very complex when multiple levels of nesting of arrays and records are used.

Moreover, one should be able to use arrays and records for variables and signals which may or may not be inferred as registers. In other words, there should be no predefined assumption that arrays are only to be used by variables or signals which are implemented as registers. This generalization makes the synthesis task more complex because there may not be a single register bank representing the array, but the array variable may be implemented as multiple nets in the network.

Commercial synthesis systems can handle record and array types in a limited way. From a specification point of view, these systems usually restrict the data types that can be defined in a design as well as the set of operations that can be used on them. For instance, multi-dimensional arrays, mixing of record and array structures are typically not supported. These restrictions severely limit the advantages of using high-level languages and constrain the designer's ability to specify the design succinctly. From an implementation point of view, most of the existing work has focused on mapping objects of array type onto physical memory modules. The main problems addressed by these works are the partitioning and/or grouping of array objects of different sizes into physical memories of fixed sizes. The problem of synthesizing pointers and arrays has also been addressed in a limited way.

Therefore, a need exists for a system and method for synthesizing complex data types. A further need exists, for synthesizing arrays and records.

SUMMARY OF THE INVENTION

A method for synthesizing aggregate data types, in accordance with the present invention, includes representing aggregate data types in a control data flow graph, by representing aggregate objects as operand nodes, and operations on the aggregate objects as operation nodes. One-dimensional bit vectors are formed for the operand nodes, by recursively traversing through fields of the aggregate data type associated with the aggregate objects. Read and write operation nodes are formed in the control data flow graph for representing language constructs for accessing the aggregate objects. The control data flow graph is mapped onto hardware.

Another method for synthesizing aggregate data types, including multi-dimensional arrays, records and nested data structures, in accordance with the invention, includes representing aggregate data types in a control data flow graph, by representing aggregate objects as operand nodes, and operations on the aggregate objects as operation nodes. One-dimensional bit vectors are formed for the operand nodes, by recursively traversing through fields of the aggregate data type associated with the aggregate objects. Read and write operation nodes are formed in the control data flow graph for representing language constructs for accessing the aggregate objects. The control data flow graph is mapped onto hardware by representing the operand nodes as one of at least one storage element and a net, based on register inference rules of very high speed integration circuit hardware description language (VHDL) synthesis. The control data flow graph is also mapped onto hardware by mapping the operation nodes of the control data flow graph for a plurality of addressing methods.

In alternate methods, the step of representing aggregate data types in a control data flow graph may include the steps of representing language constructs for accessing the aggregate objects of the operand nodes as the operation nodes, and connecting nodes corresponding to aggregate objects and operations on the aggregate objects by directed edges. The step of representing language constructs for accessing the aggregate objects may include the steps of representing access operations with a constant index as a slice operation on bit vector representations of the aggregate objects, and generating a read/write operation for access operations with a variable index. The step of mapping the control data flow graph onto hardware may include the step of representing the operand nodes as one of at least one storage element and a net, based on register inference rules of very high speed integration circuit hardware description language (VHDL) synthesis. The step of forming one-dimensional bit vectors may include the step of flattening each aggregate data type into a bit-vector by concatenating elements of the aggregate data type in a hierarchical manner.

In other methods, the step of mapping the control data flow graph onto hardware may include the step of mapping operation nodes of the control data flow graph for a plurality of addressing methods. The steps of storing bias information for indicating where a dimension starts in the one-dimensional bit vectors, storing left and right bounds and a size of the dimension wherein the bias information, the left and right bounds and the size are inputs to at least one of the read operation and the write operation to provide access to the aggregate data types in a plurality of different addressing methods may also be included. The step of mapping the control data flow graph onto hardware may include the step of synthesizing a read operation by employing a set of multiplexers connected in series wherein inputs and outputs of the multiplexers are dependent on bias information, left and right bounds and a size of each dimension being accessed during operations. The step of mapping the control data flow graph onto hardware may include the step of synthesizing a write operation by employing a plurality of multiplexers and decoding logic wherein inputs and outputs of the multiplexers are dependent on bias information, left and right bounds and a size of each dimension being accessed during operations. The aggregate data types may include at least one of records, multi-dimensional arrays and nested arrays and records.

In still other methods, the step of mapping the control data flow graph onto hardware may include the step of mapping a read operation onto hardware by representing a read node operation, $D=F_1(d_1).F_2(d_2) \ldots F_n(d_n)$, where F includes a one-dimensional bit-vector representation, for each dimension i from 1 to n, setting a number of inputs equal to a difference between a left bound(i) of the one-dimensional bit-vector representation and a right bound(i) of the one-dimensional bit-vector representation and adding one to the difference, creating multiplexers $M_i$ having the number of inputs in the setting step, each multiplexor having a size of i bits, computing a starting bit position, sp(i), for dimension i in F, using a bias (i) value indicating the starting bit position in the one-dimensional bit-vector representation, connecting the inputs to the multiplexors $M_i$, each of size(i) bits, starting at bit position sp(i) in F, connecting an address input $d_i$ to a control input of multiplexors $M_i$, and providing outputs of the multiplexors $M_i$ in accordance with the operation $D=F_1(d_1).F_2(d_2) \ldots F_n(d_n)$. The step of mapping the control data flow graph onto hardware may include the step of mapping a write operation onto hardware by representing an operation W by $F_1(d_1).F_2(d_2)\ldots F_n(d_n)=D$, where F is a one-dimensional bit-vector representation, and CV represents a current value of F, for each dimension i from 1 to n, creating a decoder $DEC_i$ with input $d_i$ and outputs for all possible values of $d_i$, for each bit position p in F, if p is within a range of bit positions accessed by W then, calculating index values $(iv_1, iv_2, \ldots)$ for each dimension corresponding to position p, calculating bit position, bp, in input data D corresponding to position p, generating control decoder circuits providing a function $AND(DEC_1(iv_1), \ldots, DEC_n(iv_n))$, generating multiplexers $M_p$ in accordance with CV(p), D(bp) and the control decoder circuits such that $F(p)=M_p$, and otherwise set F(p) equal to CV(p).

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

The present invention includes a comprehensive method to synthesize aggregate data types. The methods of the present invention can synthesize arrays, records and their composites such as arrays of records, records of arrays, to any level of nesting, including all types of access operations (e.g., indexed, slice, etc.). The present invention provides a full synthesis process of aggregate data types, from a programming language point, to the actual logic implementation. Illustratively, the present invention includes three stages, namely: 1) mapping language aggregate data types and access operations to control and data flow graph nodes (which is the internal representation for high-level synthesis); 2) mapping the control and data flow graph nodes into a register-transfer-level (RTL) network; and 3) mapping this RTL network into a gate level netlist.

An internal graph representation of the language description is generated. This representation is normally called Control and Data Flow Graph (CDFG). To be able to synthesize aggregate data types in a general way, the CDFG of the present invention is general enough to represent all possible types and operations on these aggregate data types.

The CDFG representation of the present invention preferably employs two types of nodes: operand nodes, representing the variables and signals of general data types, and operation nodes, representing the language constructs accessing the variables and signals. These nodes are connected by directed edges.

An RTL or gate-level network (as used by logic synthesis) includes registers and nets which include 1-dimensional elements, for example, a 16-bit register or net. Hence, at some point in the synthesis process, any data type more complex than a 1-dimensional array of bits is flattened to one dimension so the 1-dimensional array may be implemented as logic. 2-dimensional elements for RAMs/ROMs may be provided; however, the problem then is simply moved to 3 or more dimensions. Note that a dimension in this context means a grouping of bits. So, an array of bit-vectors is, in fact, a 2-dimensional array of bits.

The present invention advantageously represents aggregate data types as flat bit-vectors. For synthesis reasons, it is efficient to represent all data types as 1-dimensional elements (herein referred to as bit-vectors). There are several possible approaches for converting an operand of complex data type to bit-vectors, namely: 1) flatten the data type completely into one bit-vector, or 2) split the data type into multiple elements representing all its constituent fields as scalar types or bit vectors.

Flattening the data type has the advantage that the operand remains represented as a single operand node, but one has to keep track of all different types of operations accessing the operand and its fields. Alternatively, splitting the data type into multiple operand nodes has the advantage that accessing individual fields and array elements become simpler. However, it becomes more difficult to keep track of the data type as a whole. Another strong disadvantage of splitting is that, ports (input/output signals) declared as complex data types would be split into multiple ports. Given that the I/O definition of a design should not be changed by synthesis, splitting ports is generally unacceptable. Hence, the preferred solution includes flattening the data types into bit-vectors.

The flattened operand node is created by concatenating each element of the aggregate, one after the other, in a fully hierarchical manner. Thus, the size of the vector representing a record type is given by the sum of the sizes of its fields. Similarly, the size of the vector representing an array is given by the size of its elements multiplied by the number of elements in the array.

The flattening of aggregate types is preferably performed recursively. In case of a record, if one of the records fields is another array or record type, then this field is flattened first before concatenating the field into a bit-vector representing the record type. Similarly, if the element of an array is another array or record type, then the element is flattened first and then inserted into the bit-vector representing the parent array. This is a general scheme which can represent any aggregate data type with any level of hierarchy, as well as general dimension ranges, including ascending/descending/mixed and negative ranges.

Figure 1A:
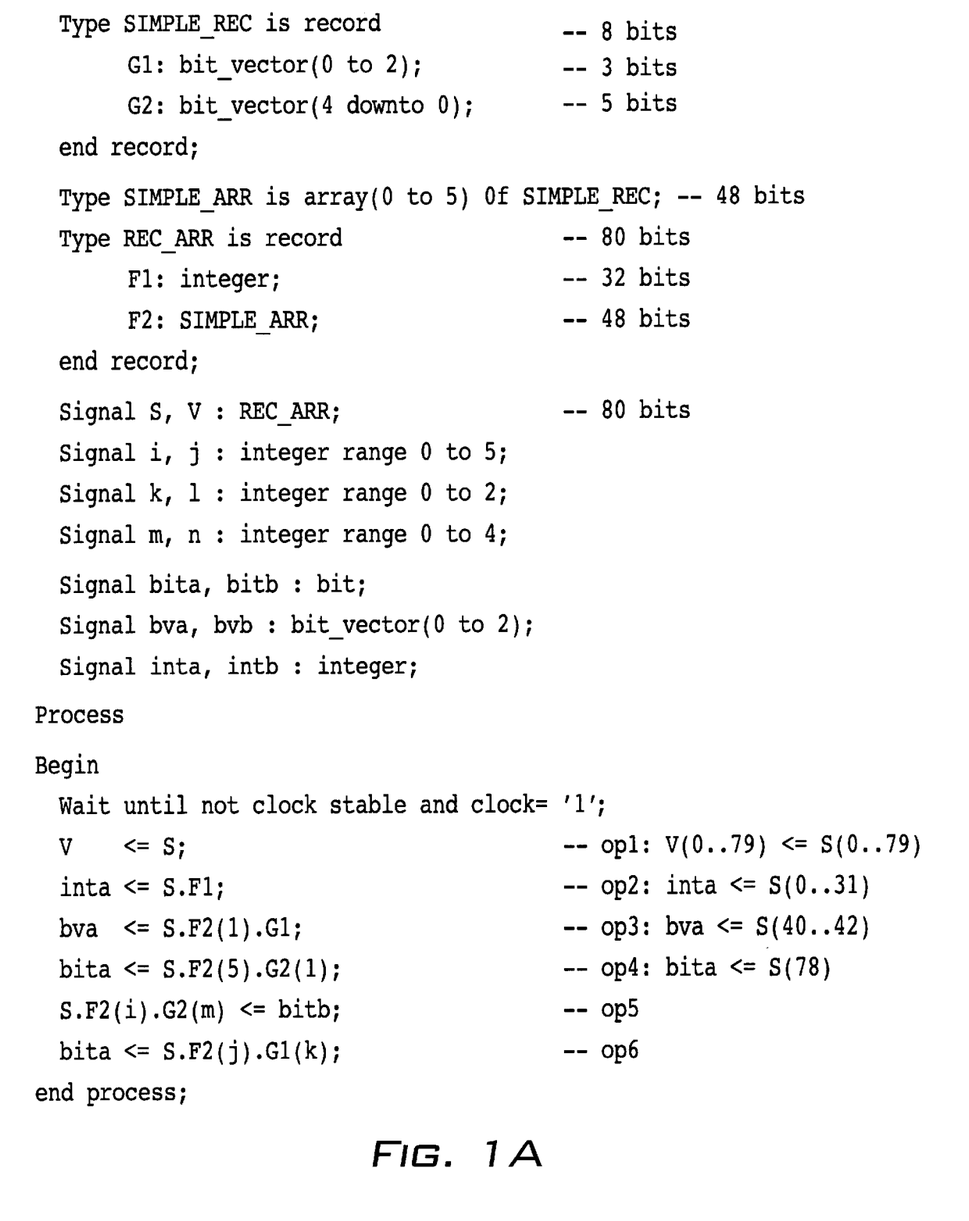
FIG. 1A is an illustrative example of a complex data type (aggregate data type) construction language for a VHDL fragment in accordance with the present invention.
Figure 1B:
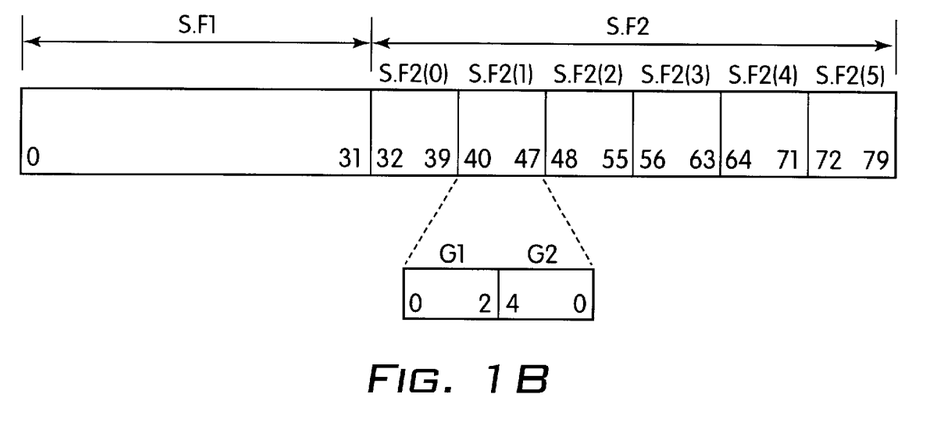
FIG. 1B is a one dimensional bit-vector for an aggregate data object in accordance with the present invention.
Figure 1C:
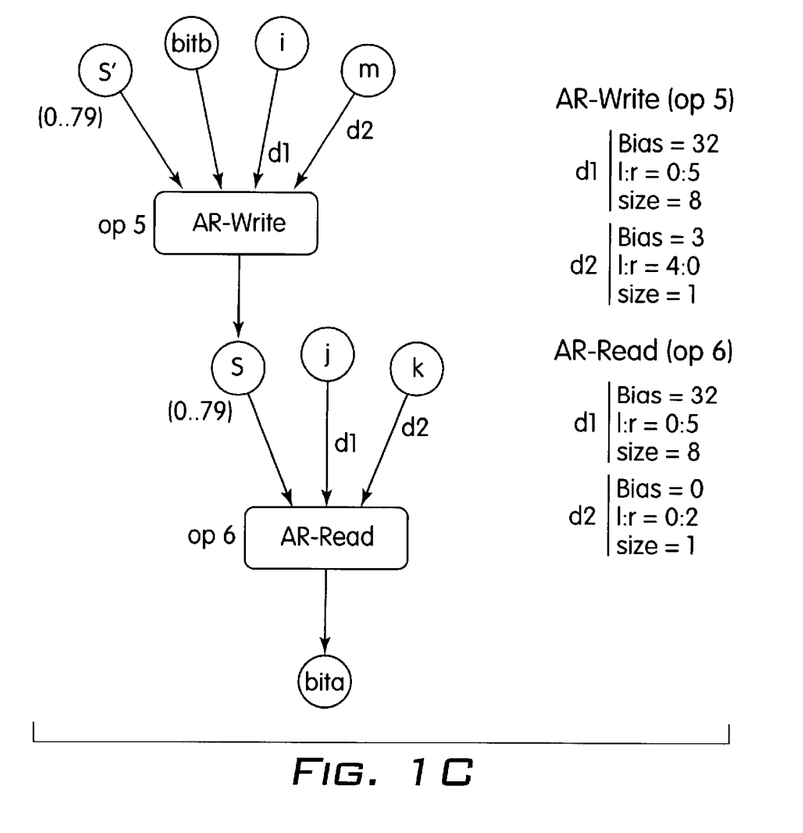
FIG. 1C is a fragment of a control data flow graph showing a write operation and a read operation in accordance with the present invention.

Referring now to the drawings in which like numerals represent the same or similar elements and initially to FIGS. 1A–1C, examples of complex data types are illustratively shown. In FIG. 1A a VHDL fragment is shown. In FIG. 1B, a flattened representation of a signal S of FIG. 1A, and in FIG. 1C, a CDFG fragment is shown.

Considering FIGS. 1A–1C, which will be used throughout this disclosure to illustratively describe the present invention. Type SIMPLE_ARR is a 1-dimensional array of objects of type SIMPLE_REC, comprising 48 bits in total. Type REC_ARR is a record with two fields, comprising 80 bits in total. FIG. 1B illustrates a flattened structured for signal S of type REC_ARR and its relation to the constituent record and arrays. The first 32 bits are used to represent the integer type for record field F1, the last 48 bits are used for the second field F2 of SIMPLE_ARR type. There are six 8-bit elements in this array. The first element of the array (S.F2(0)) occupies the first 8 bits of the array, the second element (S.F2(1)) the next 8 bits and so on.

Operations are represented on aggregate data types by the present invention. Aggregate data types can be accessed in a combination of different ways. Records can be accessed as a whole or via each field. Arrays can be accessed as a whole, via an index, or via a slice. Both record fields and array elements represent slices or sub-ranges of the flattened bit-vector representation. The location and size of the slice depend on the relative position and size of the field or array element being accessed in the bit-vector. FIG. 1A illustrates some of these cases. For example, to find the bit represented by the expression S.F2(5).G2(1), one needs to find the starting bit position for S.F2(5), which is bit number 72. Then, add the offset of 3 (for the field G1), and add 3 for the offset from the leftmost bit index of G2 to the index value requested of G2, which gives the final bit number 78.

To be able to synthesize these operations in a general way, two special operations have been developed in accordance with the invention for the CDFG. These operations are called Array/Record-Read (AR-Read) for operations retrieving data from aggregate objects, and Array/Record-Write (AR-Write) for operations assigning new values to fields of aggregate objects. (See e.g., FIG. 1C).

The inputs to an AR-Read operation are the operand node representing the aggregate object itself (its flattened representation) and a list of address indexes, one for each dimension being accessed. The output of the AR-Read operation is the bit or set of bits specified by the given set of addresses.

Similarly, the inputs to an AR-Write operation include a current value of the aggregate type object (represented by an operand node), the new data being assigned to the aggregate type object, and the list of address indexes, one for each dimension being accessed. The AR-Write operation updates the bit or set of bits specified by the list of addresses with the new data value, and preserves the current value for the remaining bits which are not being assigned.

To capture all possible addressing schemes accessing aggregate types, the AR-Read and AR-Write nodes need to store the following information, for each dimension, which is derived during CDFG generation:

a. Bias—This is needed when arrays are embedded into records. In this case, the index of each dimension always refers to the specific dimension range, and a Bias or offset is needed to indicate where a given dimension starts within the flattened representation. The Bias value is specified for each dimension and its value is relative to the previous dimension being accessed.

b. Left and Right bounds—These are the left and right bounds of the current dimension as specified in the aggregate data type definition.

c. Size—This gives the total number of bits in each word of the current dimension.

FIG. 1C shows examples of AR-Read and AR-Write operations. Each dimension being accessed is represented by an edge (e.g., d1, d2) from the operand representing the address value. Consider, for example, AR-Write operation op5 representing statement S.F2(i).G2(m)<=bitb. There are two address edges representing the two dimensions being accessed, from operands i and m. The Bias, bounds, and Size associated with each edge are indicated in FIG. 1C. The Bias for a first dimension edge (d1) is 32 because that is the bit number of the start of the field F2 in the flattened representation (FIG. 1B). The left and right bounds on this edge are [0:5] because these are the declared bounds of type SIMPLE_ARR. The address operand i for this dimension can assume values 0 to 5. The size of each word of this dimension is 8, because each word of type SIMPLE_ARR is of type SIMPLE_REC which includes 8 bits. The second dimension edge (d2) represents an index operation on field G2 with address m. The Bias is 3 because of field G1 which has 3 bits. The left and right bounds are [4:0] and the Size is 1. A similar reasoning can be used to derive the parameters for the AR-Read operation of FIG. 1C.

Synthesizing aggregate data types is now performed. The synthesis of aggregate data types is completed by mapping of the internal representation onto hardware. This step may be subdivided into two subtasks, namely the implementation of the operand node (flattened bit-vector) and the implementation of the operation nodes.

The synthesis of operand nodes representing aggregate data types is performed as follows. An operand node representing an aggregate data type is preferably mapped either onto a storage element or a net. The choice between the two is decided by register reference rules of VHDL synthesis. For example, if the value represented by the aggregate object is updated in one clock-cycle and used in a different cycle then the operand node corresponding to the aggregate object has to be mapped onto a storage element. On the other hand, if the data is specified and consumed in the same cycle, it is simply mapped onto nets.

If an aggregate object needs to be stored, the aggregate object can either be mapped to an array of registers or onto a random access memory (RAM). The RAM implementation is limited in the sense that it maps only two-dimensional array objects. Objects of complex types, such as, record of array, multi-dimensional arrays, etc. can not be directly mapped onto RAMs. In the present invention, the case is considered where the flattened bit-vector is mapped onto register banks, or onto nets. Each bit of the flattened operand is mapped to a register bit or (single bit) net.

Synthesis of operations representing aggregate data types is also performed. When an aggregate object is accessed with a constant index, it is mapped as a slice operation on the flattened bit-vector (e.g. op2, op3 and op4 in FIG. 1A). However, if the aggregate object is accessed with a variable index, an Array/Record read/write operation is generated (e.g. op5 and op6 in FIG. 1A). The implementation of AR-Read/Write operations needs the generation of hardware for all different addressing schemes present in the description.

Synthesis of Array/Record-Read operations will now be described. An AR-Read operation is implemented with a set of multiplexers, one for each dimension. The multiplexers are connected in series from the outermost to the innermost dimensions represented in the AR-Read operation node in the CDFG. The inputs of the first multiplexer come from the flattened object itself. The inputs of the second multiplexer come from the output of the first multiplexer and so on. The multiplexer for each dimension is created based on the information attached to the corresponding address edge, namely, Bias, bounds, Size and the address operand itself. The number of inputs and the bit-width of the multiplexer used for each dimension are given by the number of elements (abs(Left bound−Right bound)+1) (abs is the absolute value) and the Size parameters respectively, for that dimension. The address operand becomes the control input to the multiplexer.

The output of the last multiplexer represents the output of the AR-Read operation. Algorithm 1 illustratively describes the steps for generating the above structure for an AR-Read operation. The run-time complexity of this algorithm is O(n), where n is the number of bits in the flattened bit-vector.

Algorithm 1: Array/Record-Read Synthesis

1. Let R be an AR-Read node representing operation $D=F_1(d_1).F_2(d_2)\ldots F_n(d_n)$, and F be the flattened bit-vector representation
2. A=F
3. for each dimension i from 1 to n do
   3.1 Num_inputs=abs(Left_Bound(i)−Right_Bound(i))+1
   3.2 Create multiplexer $M_i$ with Num_inputs, each of Size (i) bits
   3.3 Compute starting bit position sp(i) for dimension i in A, using Bias (i)
   3.4 Connect Num_inputs to $M_i$, each of Size(i) bits, starting at bit position sp(i) in A
   3.5 Connect address input $d_i$ to $M_i$ control input
   3.6 A=Output ($M_i$)
4. end for
5. D=A
6. end Referring to FIG. 2, a structure 100 for the AR-Read operation (op6) of FIG. 1C is shown. This structure 100 uses two multiplexers 102 and 104, one for each dimension. The multiplexer 102 is used to select field S.F2(j) from S. There are six inputs (number of elements in this dimension) of 8 bits (Size) in this multiplexer 102. The inputs to the multiplexer 102 are connected to six slices (0–5) of input array 106, each slice representing an element of this array (or bit vector). Note that since the Bias value for this dimension is 32, the inputs to this multiplexer start at bit 32. The first address j controls the operation of the multiplexer 102.

Figure 2:
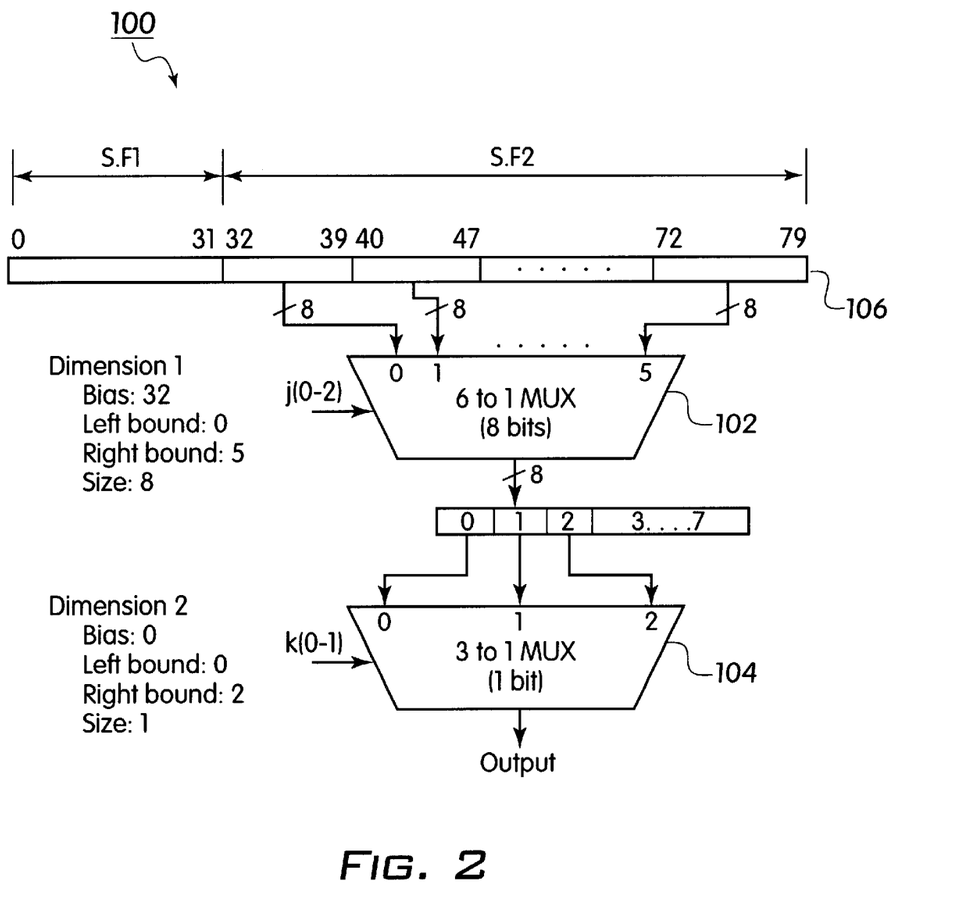
FIG. 2 is a schematic diagram showing a logic implementation of a read operation synthesized from a bit vector for accessing aggregate data types in accordance with the present invention.

The output of the first multiplexer 102 is connected to the inputs of the second multiplexer 104 which selects field G1(k) from S.F2(j). The second dimension has a Bias of 0, and it has 3 elements, 1-bit wide (see FIG. 1C). Hence, the first 3 bits of S.F2(j) are connected as inputs to the second multiplexer 104 which has k as its select input.

The output of the multiplexer 104 is the output of this AR-Read operation. Note that only the first 3 bits, corresponding to the field G1, are used in the multiplexer 104 and the last 5 bits, corresponding to the field G2, are not connected. This does not cause any inefficiency because the subsequent logic optimization step eliminates the unconnected nets and their cone of logic.

Figure 3:
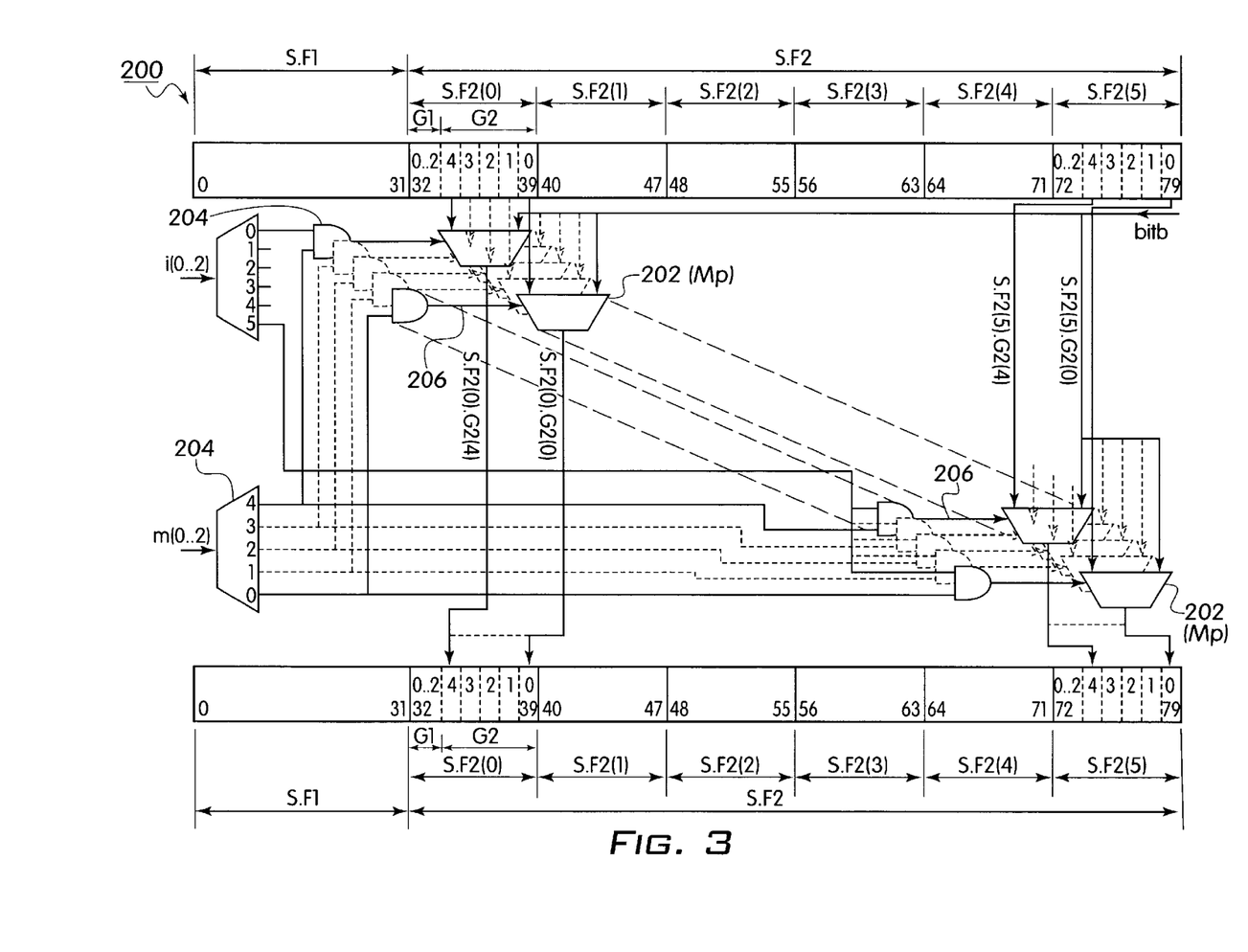
FIG. 3 is a schematic diagram showing a logic implementation of a write operation synthesized from a bit vector for accessing aggregate data types in accordance with the present invention.

Synthesis of Array/Record-Write operations is now described. An AR-Write operation is used to update a new value at a specific location in the aggregate object represented by a flattened bit-vector operand node. Referring to FIG. 3, the AR-Write operation inputs are the new data value to be written (D), a set of address edges for all dimensions being accessed ($d_i$), and the current value of the operand (CV). Based on the address values, a specific bit or set of bits in the flattened bit-vector either preserves its current value or gets a new value D.

AR-Write operations are preferably implemented with multiplexers 202 and decoding logic 204. A 1-bit 2-to-1 multiplexer $M_p$ is created for each bit in the flattened bit-vector. Each multiplexer $M_p$ selects between the corresponding bits in the new data value (D)—if the bit position p is within the selected addresses—or the current value input (CV). A control input 206 for each multiplexer $M_p$ selects the new data input if the value of p falls within the range of addresses connected to the AR-Write operation. The logic for each control input is generated by ANDing the decoded values of all address inputs.

FIG. 3 illustratively shows a synthesized structure 200 for the AR-Write operation (op5) shown in FIG. 1C. This operation may access each bit of field G2 (out of 5 bits) in SIMPLE_REC. Since there are 6 SIMPLE_REC elements in S, a total of 30 2-to-1, 1-bit multiplexers are needed for implementing this AR-Write.

Each bit position p being accessed can be identified by a unique set of values on the address lines i and m, as well as the Bias values on both dimensions. The control input 206 for each multiplexer $M_p$ is given by the AND of the corresponding decoded values of i and m. Hence a decoder is needed for each address input. The specific output from a decoder to be connected to the AND gate is selected by the address values for the bit in consideration. For example, the top-left multiplexer in FIG. 3 selects the bit representing S.F2(0).G2(4), hence its control signal is the AND of "i==0" and "m==4", which come from the respective decoders. When the control input is '1', the data input bitb is selected; otherwise the current value bit $CV_p$ is selected. For all other bit positions which are outside the range of addresses in this AR-Write operation, the bits are directly assigned from the current value CV to the output (not shown in FIG. 3). For example, bits 0–31 corresponding to field S.F2 and bits corresponding to the field S.F2.G1 are directly assigned (and no logic is required).

Algorithm 2 illustratively describes the steps for generating the above structure for an AR-Write operation. The run-time complexity of this algorithm is 0(n), where n is the number of bits in the flattened bit-vector.

Algorithm 2: Array/Record-Write Synthesis

1. Let W be an AR-Write node representing operation $F_1(d_1).F_2(d_2)\ldots F_n(d_n)=D$, and F be the flattened bit-vector representation and CV is its current value 2. for each dimension i from 1 to n do 2.1 Create decoder $DEC_i$ with input $d_i$ and outputs for all values that $d_i$ may assume 3. end for 4. for each bit position p in F do 4.1 if p is within the range of bit positions accessed by W then 4.1.1 Calculate index values ($iv_1, iv_2, \ldots$) for each dimension corresponding to position p 4.1.2 Calculate bit position bp in input data D corresponding to position p 4.1.3 Generate control=AND($DEC_1(iv_1), (DEC_2(iv_2), \ldots, DEC_n(iv_n)$))

4.1.4 Generate multiplexer $M_p$–Mux(CV(p),D(bp), control)

4.1.5 F(p)=$M_p$ 4.2 else 4.2.1 F(p)=CV(p) 4.3 end if 6. end for 7. end

The algorithms presented in this disclosure have been implemented in IBM's high-level synthesis system and have been employed by the inventors for producing several chips. The use of aggregate data types have been found to make the description of the aggregate data types more concise and easier to understand, while being able to obtain logic with smaller area and similar delay.

Algorithms 1 and 2 have been implemented in IBM's high-level synthesis system to experimentally produce several chips. The use of aggregate data types make the hardware description more concise and easier to understand, while being able to obtain logic with similar area and delay.

As an experiment, consider the AR-write operation op5 and the AR-Read operation op6 in FIG. 1A. If the synthesis of these array operations were not supported, the designer would have to recode them at a lower level, possibly using nested Case statements to decode the addresses explicitly.

To check the quality of the resulting optimized logic, AR operations using Case statements were described and submitted to full synthesis (high-level+logic synthesis). The logic synthesis was run with medium effort for delay optimization. The resulting area and delay are shown in Table 1.

TABLE 1

Comparing different descriptions for AR-Read and Ar-Write operations

|  | Area (cells) | | Delay (ns) | | VHDL lines | |
| --- | --- | --- | --- | --- | --- | --- |
|  | op5 | op6 | op5 | op6 | op5 | op6 |
| Operation in FIG. 1A |  |  |  |  |  |  |
| Array operation (using present invention) | 312 | 162 | 1.42 | 1.76 | 1 | 1 |
| Case Statement | 297 | 234 | 1.41 | 1.62 | 50 | 40 |

From Table 1, it can be seen that the area and delay for the AR-Write operation (op6) are similar for the two implementations. For the AR-Read operation, the area for AR implementation is about 30% smaller than the area of the Case-statement implementation. This area improvement can be attributed to the regularity of the logic generated for the AR-Read operation in accordance with the invention. The regular structures in the AR-Read operation were synthesized more efficiently by logic synthesis than the random logic gates produced by the Case-statement implementation. The delays for the two implementations are nearly the same. More importantly for productivity reasons, the Case-statement description required about 40–50 VHDL lines— considerably longer than the single line required for the AR descriptions. This difference in description sizes is even more dramatic for arrays with larger bounds and higher dimensions.

Table 2 shows statistics on the usage of aggregate data types in several design partitions collected from VHDL for a graphics processor chipset (3 chips). The complete design included over 250 thousand lines of VHDL code. Columns 2 and 3 of Table 2 report a total number of bits representing all objects (signals, variables and constants) declared in the VHDL and a total number of bits representing only objects of complex type (records and multi-dimensional arrays), respectively. The last column of Table 2 reports the percentage of all bits that were originally declared as complex aggregate data types out of the total number of bits used in the chip designs. The number of bits represents the total number of registers and nets in the designs.

TABLE 2

Statistics on the usage of aggregate data in chip designs.

| Chip | Objects | Complex | % Complex |
| --- | --- | --- | --- |
| 1 | 1123923 | 618262 | 55 |
| 2 | 980553 | 745852 | 76.1 |
| 3 | 17852 | 5381 | 20.1 |
| Total | 2122328 | 1369495 | 64.5 |

From Table 2, it can be seen that complex objects constitute a large percentage of the total objects used in the designs—on average 64.5% which were tested. This clearly demonstrates that complex aggregate objects constitute a large percentage of the registers and nets used in high-level designs, and illustrates the power of aggregate objects in capturing large portions of the designs in concise VHDL descriptions. The extensive use of aggregate data types and the ability to synthesize them efficiently helped reduce the size of the description and the design time considerably.

The present invention provides a comprehensive method for synthesizing aggregate data types such as arrays and records. It is to be understood, that aggregate data types includes mixtures of data structures; however, the present invention may be practiced for synthesizing any data structures or combinations thereof. The method encompasses all synthesis steps from language processing, to CDFG representation, and to logic generation. At the language level, it supports any aggregate data type, including unlimited nesting of array and record types, and general access operations (constant, indexed, sliced). An object of aggregate data type is represented as a flattened bit-vector and any access operation is represented by special read and write operations in the CDFG. These operations are preferably mapped onto logic using decoders and multiplexers. Results have shown that this method produces better logic as compared to the explicit decodification in the VHDL, while allowing significantly shorter VHDL descriptions.

Figure 4:
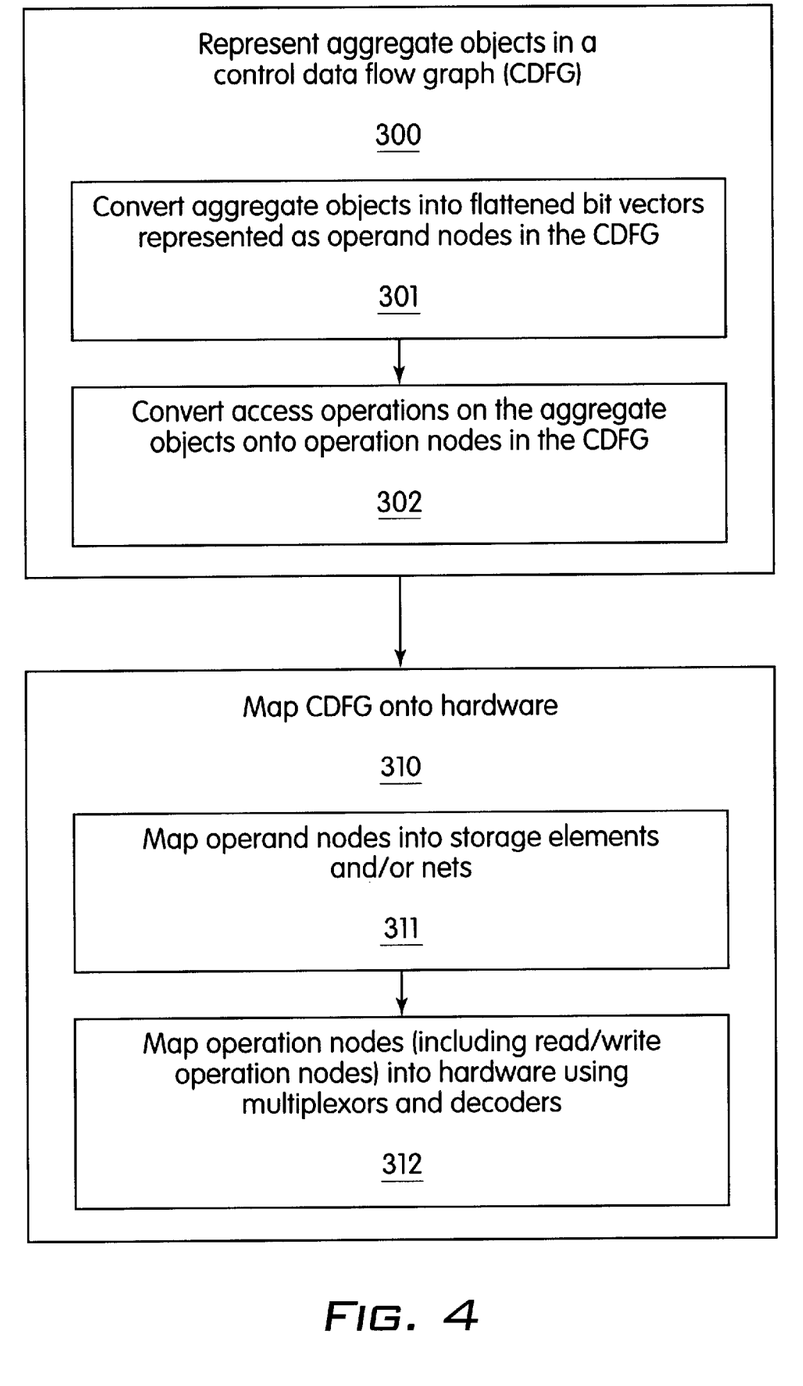
FIG. 4 is a block/flow diagram for a system/method for synthesizing aggregate data types in accordance with the present invention.

It should be understood that the elements shown in FIG. 4 may be implemented in various forms of hardware, software or combinations thereof. Preferably, these elements are implemented in software on one or more appropriately programmed general purpose digital computers having a processor and memory and input/output interfaces. Referring now to FIG. 4, a method for synthesizing aggregate data types is shown. In block 300, aggregate data types, such as, for example, record and array data types, are represented in a control data flow graph. Signals and variables are represented as operand nodes. Related nodes are connected by directed edges. In block 301, a hierarchical data structure of the aggregate data types is reduced into one-dimensional bit vectors, (i.e., the operand nodes are flattened). The flattening process is carried out by recursively traversing through the data structure which may include record and array data types, thereby reducing multidimensional data types to one-dimensional bit vectors. The bit vectors are formed by flattening each aggregate data type and then concatenating elements of the aggregate data type in a hierarchical pattern. In block 302, language constructs for accessing signals and variables are represented as operation nodes. The operation nodes preferably include the specialized read and write operations for accessing data stored in record and array data types.

In block 310, the control data flow graph is mapped onto hardware by representing the operations based on the one-dimensional bit vectors of the operands for a plurality of different addressing methods. The addressing methods may include access as a whole or by field for records, and access by a whole, an index or a slice for arrays. Other addressing methods may also be employed. In block 311, the operand nodes may be represented or generated as storage elements or nets, based on register inference rules. In block 312, the mapping may include representing and generating the operation nodes with a constant index as a slice operation on a bit vector and generating a read/write operation for operation nodes with a variable index. Access to any field of any data type is provided by a read operation or a write operation. A read operation is employed for retrieving data from the aggregate data types, and a write operation is employed for assigning new values to the aggregate data types. These operations are mapped onto the hardware of, for example, an integrated circuit chip using algorithms 1 and 2 described above. The read/write operations include storing bias information for indicating where a dimension starts in the one-dimensional bit vectors and storing left and right bounds and a size of the dimension. The bias information, the left and right bounds and the size are inputs used for the read operation and the write operation to provide access to the aggregate data types for the plurality of different addressing methods. This information provides a basis for synthesizing the circuit(s).

Mapping the control data flow graph onto hardware includes realizing a read operation by employing a set of multiplexers connected in series wherein inputs and outputs of the multiplexers are dependent on the bias information, the left and right bounds and the size of each dimension being accessed. A write operation is generated by employing a plurality of multiplexers and decoding logic wherein inputs and outputs of the multiplexers are dependent on the bias information, the left and right bounds, and the size of each dimensions being accessed. These hardware realizations are sized and wired as described in greater detail above.

Having described preferred embodiments of a system and method synthesis of arrays and records (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for synthesizing aggregate data types comprising the steps of:

representing aggregate data types in a control data flow graph, by representing aggregate objects as operand nodes, and operations on the aggregate objects as operation nodes;

forming one-dimensional bit vectors for the operand nodes, by recursively traversing through fields of the aggregate data type associated with the aggregate objects;

forming read and write operation nodes in the control data flow graph for representing language constructs for accessing the aggregate objects; and mapping the control data flow graph onto hardware.

2. The method as recited in claim 1, wherein the step of representing aggregate data types in a control data flow graph includes the steps of:

representing language constructs for accessing the aggregate objects of the operand nodes as the operation nodes; and connecting nodes corresponding to aggregate objects and operations on the aggregate objects by directed edges.

3. The method as recited in claim 2, wherein the representing language constructs for accessing the aggregate objects includes the steps of:

representing access operations with a constant index as a slice operation on bit vector representations of the aggregate objects; and generating a read/write operation for access operations with a variable index.

4. The method as recited in claim 1, wherein the step of mapping the control data flow graph onto hardware includes the step of representing the operand nodes as one of at least one storage element and a net, based on register inference rules of very high speed integration circuit hardware description language (VHDL) synthesis.

5. The method as recited in claim 1, wherein the step of forming one-dimensional bit vectors includes the step of flattening each aggregate data type into a bit-vector by concatenating elements of the aggregate data type in a hierarchical manner.

6. The method as recited in claim 1, wherein the step of mapping the control data flow graph onto hardware includes the step of mapping operation nodes of the control data flow graph for a plurality of addressing methods.

7. The method as recited in claim 1, further comprising the steps of:
storing bias information for indicating where a dimension starts in the one-dimensional bit vectors;
storing left and right bounds and a size of the dimension wherein the bias information, the left and right bounds and the size are inputs to at least one of the read operation and the write operation to provide access to the aggregate data types in a plurality of different addressing methods.

8. The method as recited in claim 1, wherein the step of mapping the control data flow graph onto hardware includes the step of synthesizing a read operation by employing a set of multiplexers connected in series wherein inputs and outputs of the multiplexers are dependent on bias information, left and right bounds and a size of each dimension being accessed during operations.

9. The method as recited in claim 1, wherein the step of mapping the control data flow graph onto hardware includes the step of synthesizing a write operation by employing a plurality of multiplexers and decoding logic wherein inputs and outputs of the multiplexers are dependent on bias information, left and right bounds and a size of each dimension being accessed during operations.

10. The method as recited in claim 1, wherein the aggregate data types include at least one of records, multi-dimensional arrays and nested arrays and records.

11. The method as recited in claim 1, wherein the step of mapping the control data flow graph onto hardware includes the step of mapping a read operation onto hardware by:
representing a read node operation, $D=F_1(d_1).F_2(d_2) \ldots F_n(d_n)$, where F includes a one-dimensional bit-vector representation;
for each dimension i from 1 to n:
setting a number of inputs equal to a difference between a left bound(i) of the one-dimensional bit-vector representation and a right bound(i) of the one-dimensional bit-vector representation and adding one to the difference;
creating multiplexers $M_i$ having the number of inputs in the setting step, each multiplexor having a size of i bits;
computing a starting bit position, sp(i), for dimension i in F, using a bias (i) value indicating the starting bit position in the one-dimensional bit-vector representation;
connecting the inputs to the multiplexors $M_i$, each of size(i) bits, starting at bit position sp(i) in F;
connecting an address input $d_i$ to a control input of multiplexors $M_i$; and
providing outputs of the multiplexors $M_i$ in accordance with the operation $D=F_1(d_1).F_2(d_2) \ldots F_n(d_n)$.

12. The method as recited in claim 1, wherein the step of mapping the control data flow graph onto hardware includes the step of mapping a write operation onto hardware by:
representing an operation W by $F_1(d_1).F_2(d_2) \ldots F_n(d_n)=D$, where F is a one-dimensional bit-vector representation, and CV represents a current value of F;
for each dimension i from 1 to n:
creating a decoder $DEC_i$ with input $d_i$ and outputs for all possible values of $d_i$;
for each bit position p in F:
if p is within a range of bit positions accessed by W then, calculating index values ($iv_1, iv_2, \ldots$) for each dimension corresponding to position p;
calculating bit position, bp, in input data D corresponding to position p;
generating control decoder circuits providing a function $AND(DEC_1(iv_1), \ldots, DEC_n(iv_n))$;
generating multiplexers $M_p$ in accordance with CV(p), D(bp) and the control decoder circuits such that $F(p)=M_p$; and
otherwise set F(p) equal to CV(p).

13. A method for synthesizing aggregate data types, including multi-dimensional arrays, records and nested data structures, comprising the steps of:
representing aggregate data types in a control data flow graph, by representing aggregate objects as operand nodes, and operations on the aggregate objects as operation nodes;
forming one-dimensional bit vectors for the operand nodes, by recursively traversing through fields of the aggregate data type associated with the aggregate objects;
forming read and write operation nodes in the control data flow graph for representing language constructs for accessing the aggregate objects;
mapping the control data flow graph onto hardware by representing the operand nodes as one of at least one storage element and a net, based on register inference rules of very high speed integration circuit hardware description language (VHDL) synthesis; and
mapping the control data flow graph onto hardware by mapping the operation nodes of the control data flow graph for a plurality of addressing methods.

14. The method as recited in claim 13, wherein the step of representing aggregate data types in a control data flow graph includes the steps of:
representing language constructs for accessing the aggregate objects of the operand nodes as the operation nodes; and
connecting nodes corresponding to aggregate objects and operations on the aggregate objects by directed edges.

15. The method as recited in claim 14, wherein the representing language constructs for accessing the aggregate objects includes the steps of:
representing access operations with a constant index as a slice operation on bit vector representations of the aggregate objects; and
generating a read/write operation for access operations with a variable index.

16. The method as recited in claim 13, wherein the step of forming one-dimensional bit vectors includes the step of flattening each aggregate data type into a bit-vector by concatenating elements of the aggregate data type in a hierarchical manner.

17. The method as recited in claim 13, further comprising the steps of:
storing bias information for indicating where a dimension starts in the one-dimensional bit vectors;
storing left and right bounds and a size of the dimension wherein the bias information, the left and right bounds and the size are inputs to at least one of the read operation and the write operation to provide access to the aggregate data types in the plurality of different addressing methods.

18. The method as recited in claim 13, wherein the step of mapping the control data flow graph onto hardware by mapping the operation nodes includes the step of synthesizing a read operation by employing a set of multiplexers connected in series wherein inputs and outputs of the multiplexers are dependent on bias information, left and right bounds and a size of each dimension being accessed during operations.

19. The method as recited in claim 13, wherein the step of mapping the control data flow graph onto hardware by mapping the operation nodes includes the step of synthesizing a write operation by employing a plurality of multiplexers and decoding logic wherein inputs and outputs of the multiplexers are dependent on bias information, left and right bounds and a size of each dimension being accessed during operations.

20. The method as recited in claim 13, wherein the step of mapping the control data flow graph onto hardware by mapping the operation nodes includes the step of mapping a read operation onto hardware by:

representing a read node operation, $D=F_1(d_1).F_2(d_2) \ldots F_n(d_n)$, where F includes a one-dimensional bit-vector representation;

for each dimension i from 1 to n:
setting a number of inputs equal to a difference between a left bound(i) of the one-dimensional bit-vector representation and a right bound(i) of the one-dimensional bit-vector representation and adding one to the difference;
creating multiplexers $M_i$ having the number of inputs in the setting step, each multiplexor having a size of i bits;
computing a starting bit position, sp(i), for dimension i in F, using a bias (i) value indicating the starting bit position in the one-dimensional bit-vector representation;
connecting the inputs to the multiplexors $M_i$, each of size(i) bits, starting at bit position sp(i) in F;
connecting an address input $d_i$ to a control input of multiplexors $M_i$; and
providing outputs of multiplexors $M_i$ in accordance with the operation $D=F_1(d_1).F_2(d_2) \ldots F_n(d_n)$.

21. The method as recited in claim 13, wherein the step of mapping the control data flow graph onto hardware by mapping the operation nodes includes the step of mapping a write operation onto hardware by:

representing an operation W by $F_1(d_1).F_2(d_2) \ldots F_n(d_n)=D$, where F is a one-dimensional bit-vector representation, and CV represents a current value of F;

for each dimension i from 1 to n:
creating a decoder $DEC_i$ with input $d_i$ and outputs for all possible values of $d_i$;

for each bit position p in F:
if p is within a range of bit positions accessed by W then, calculating index values ($iv_1, iv_2, \ldots$) for each dimension corresponding to position p;
calculating bit position, bp, in input data D corresponding to position p;
generating control decoder circuits providing a function $AND(DEC_1(iv_1), \ldots, DEC_n(iv_n))$;
generating multiplexers $M_p$ in accordance with CV(p), D(bp) and the control decoder circuits such that $F(p)=M_p$; and
otherwise set F(p) equal to CV(p).

* * * * *